United States Patent [19]

Ferro et al.

[11] 4,145,708
[45] Mar. 20, 1979

[54] POWER MODULE WITH ISOLATED SUBSTRATES COOLED BY INTEGRAL HEAT-ENERGY-REMOVAL MEANS

[75] Inventors: Armand P. Ferro; John D. Harnden, Jr., both of Schenectady; Michael H. McLaughlin, Scotia, all of N.Y.

[73] Assignee: General Electric Company, Schenectady, N.Y.

[21] Appl. No.: 805,734

[22] Filed: Jun. 13, 1977

[51] Int. Cl.² ............................................. H01L 25/04
[52] U.S. Cl. ........................................ 357/82; 357/80; 357/81
[58] Field of Search ............................. 357/80, 81, 82

[56] References Cited

U.S. PATENT DOCUMENTS

| 4,037,270 | 7/1977 | Ahmann et al. | 357/82 |
| 4,069,497 | 1/1978 | Steidlitz | 357/80 |

Primary Examiner—Edward J. Wojciechowicz
Attorney, Agent, or Firm—Mark P. Kahler; Joseph T. Cohen; Marvin Snyder

[57] ABSTRACT

The evaporating area of a heat pipe or thermosiphon evaporator is used as the thermal sink for one face of an electrically isolated substrate upon the opposite face of which are mounted and interconnected one or more power semiconductors and other components requiring cooling. Both sides of semiconductor devices mounted on the isolating substrate may be cooled while allowing each of a plurality of different combinations of electrical devices and/or interconnections to be achieved.

12 Claims, 3 Drawing Figures

POWER MODULE WITH ISOLATED SUBSTRATES COOLED BY INTEGRAL HEAT-ENERGY-REMOVAL MEANS

BACKGROUND OF THE INVENTION

The present invention relates to means for conducting heat energy from a source and, more particularly, to a novel isolated power module substrate cooled by an integral heat-pipe or thermosiphon and having a combination of heat-producing semiconductor devices interconnected thereon.

It is known to cool high power semiconductor devices by mounting one or more such devices upon heat sinks, such as large aluminum extrusions and the like, whereby the increased surface area of the extruded heat sink carries large amounts of heat energy away from the semiconductor devices. When such extruded heat sinks are used for very high power semiconductor applications, the modules comprised of device and heat sink are generally of relatively large size and weight whereby these modules are not easily interchanged by a single person, especially in that the alignment of modules relative each to the other, at the location of a particular module within an equipment is relatively critical. It is known to use a heat-pipe (a liquid-vapor phase interchange device employing a wicking structure substantially, if not totally, covering the interior surface thereof) or a thermosiphon (another liquid-vapor phase interchange device devoid of an interior surface wicking material and dependent upon gravity for return of liquid condensed from the heated vapor to a liquid reservoir adjacent to the source producing the heat energy to be removed) to cool high power semiconductor devices. Typical heat-pipe and/or thermosiphon arrangements are described and claimed in U.S. Pat. No. 3,826,957, issued July 30, 1974; 3,852,803; 3,852,804; 3,852,805 and 3,852,806, all issued December 3, 1974; and all assigned to the assignee of the present application. Each of the aforementioned patents requires that a semiconductor device be clamped or otherwise substantially permanently attached to, a heat transfer device adjacent to each side of a semiconductor device to be cooled. Thus, relatively rapid interchange of semiconductor devices upon a particular heat pipe/thermosiphon cooling device is particularly difficult and time consuming; the thermal interface between device and the heat exchange apparatus (heat pipe or thermosiphon) is less than ideal and generally highly dependent upon mechanical pressure; and electrical isolation is difficult to obtain between terminals of a single semiconductor device mounted in such apparatus. It is extremely difficult to mount a plurality of semiconductor devices, either with interconnection therebetween or completely electrically independent of each other, upon a common heat exchange device as hitherto known to the art.

Accordingly, it is one object of the present invention to provide a low cost heat exchange means capable of cooling a plurality of high power semiconductor devices.

It is another object of the present invention to provide a novel heat exchange device allowing relatively rapid interchange of semiconductor devices mounted thereon.

It is a further object of the present invention to provide a novel heat exchange device allowing a plurality of semiconductor devices to be mounted thereon for cooling purposes, with each semiconductor device electrically isolated from the others and from the cooling means.

It is still another object of the present invention to provide a novel heat exchange device providing for removal of heat energy from each of a pair of opposed sides of a semiconductor device while maintaining electrical isolation therebetween.

In accordance with the invention, a power module has heat exchange apparatus of the liquid-vapor phase-exchange type having a reservoir partially enclosed by a plate having, upon the interior surface thereof and extending into the cooling fluid, a wick structure to enhance the boiling heat transfer into the fluid and having upon the opposite exterior face thereof, opposite the wick structure, insulating means for mounting at least one heat-producing semiconductor device. The at least one semiconductor device is interchangeable by removing the closing plate, with the attached wick structure, for rapid replacement.

In one preferred embodiment, the insulating member is fabricated of beryllia (BeO) to provide sufficient strength and heat conduction capacity, and the wick structure is a volume of felt-metal wicking material. Another preferred embodiment has the beryllia insulating member directly bonded to the reservoir as the partial closure means therefor, allowing deletion of the plate structure.

In yet another preferred embodiment, the evaporating surface is a structured boiling fin surface having increased area for increased heat transfer.

In still another preferred embodiment, a plurality of heat-producing semiconductor components are mounted upon the insulating structure in spaced apart fashion to provide electrical isolation. Lead means fastened to an end of the semiconductor structure furthest from the insulating member are each fastened to conductive pads, isolated from each other and from the semiconductor components, to allow heat energy emanating from the semiconductor device through associated leads to be conducted to the wick structure for two-sided cooling of each semiconductor device.

In another preferred embodiment, one electrode of each of a plurality of semiconductor devices is mounted on a conductive pad bonded to the insulating member and each remaining electrode of each semiconductor device is bonded to other pads fabricated upon another insulating member, with that member partially enclosing a reservoir portion of additional heat exchange apparatus, to facilitate removal of large amounts of heat energy from two opposing sides of a multiple device circuit.

The structure and operation of these novel power modules with isolated substrates cooled by integral heat-energy-removal means will be more clearly understood by reference to the following detailed description and the associated drawings.

DETAILED DESCRIPTION OF THE INVENTION

Figure 1:
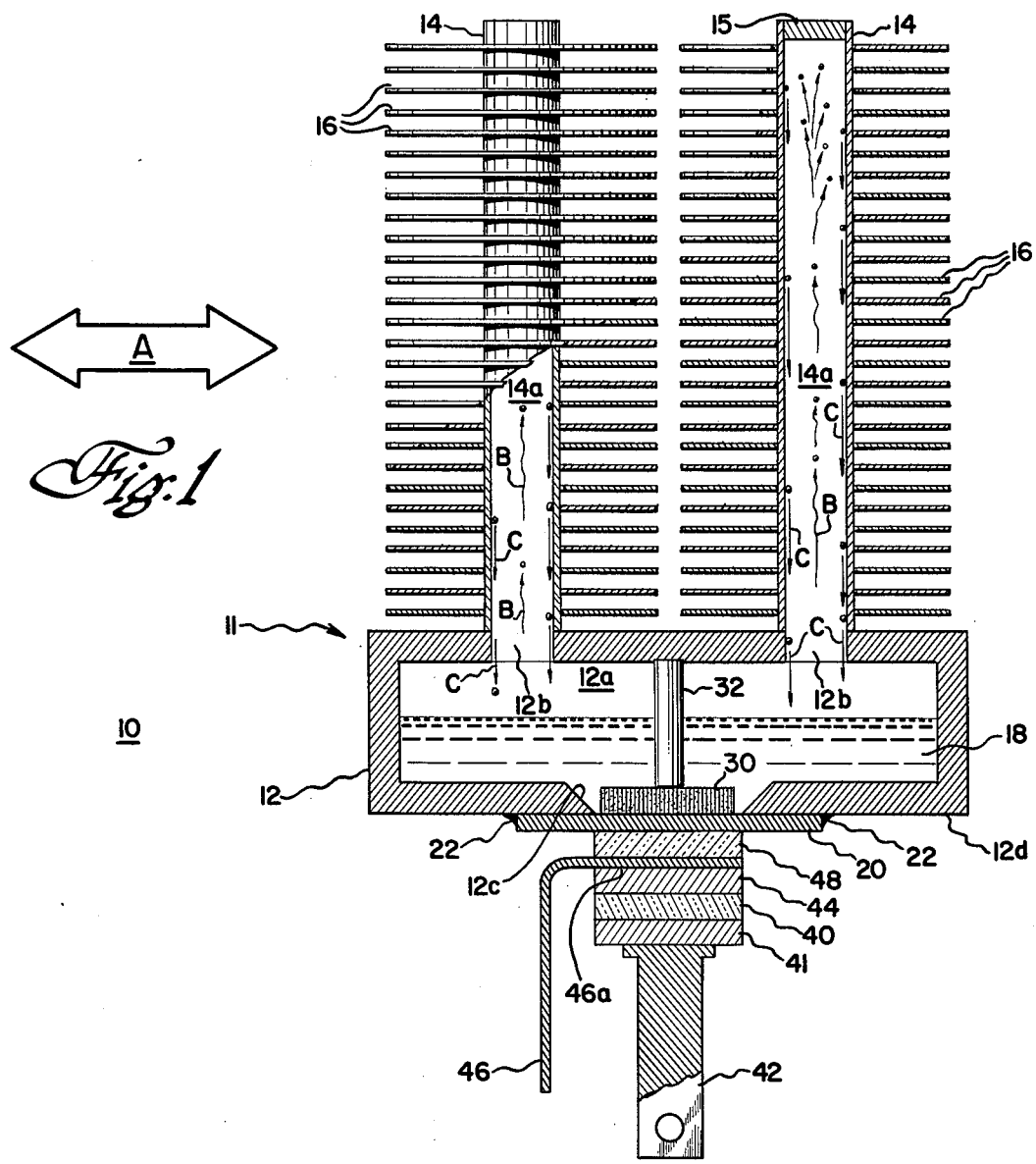
FIG. 1 is a sectional side view of a first preferred embodiment of a power module with isolated substrate cooled by integral heat-energy-removal means.

Referring initially to FIG. 1, a power module 10 comprises heat-energy-removable means 11, which may be one or more thermosiphons (preferred for high power densities) or heat-pipes, having a reservoir 12, such as the illustrated hollow block of heat conductive material, and at least one hollow member 14 having the interior volume 14a thereof in communication with the interior volume 12a of the reservoir, via openings 12b in the latter. Each hollow member 14 is closed at the end 14b thereof furthest from reservoir 12, as by a capping member 15. If required, a plurality of structured members 16, such as annular cooling fins and the like, may be added to the exterior surface of members 14 to increase the effective heat-dissipating area thereof, whereby a flow of air in the direction of arrows A may conduct additional heat energy away from the exterior surfaces of members 14. Reservoir 12 is partially filled with a coolant fluid 18, which, upon receiving heat energy, is converted from the liquid state to the gaseous state and rises vertically through the interior bore volume 14a of the members, in the direction of arrows B. The coolant vapor eventually contacts the cooler interior walls of member 14, surrendering thereto a portion of its heat energy sufficient to cause a phase transition to the liquid phase, whereupon the now liquid coolant is illustratively returned, by gravity in the direction of arrows C, to the reservoir of coolant 18.

In the preferred embodiment, as shown, the heat-energy-removal means 11 is a non-wicked, gravity-fed thermosiphon, although wicking material may be added partially, or completely, along the interior surface of hollow members 14 to realize heat-pipe apparatus, which may be disposed with orientation other than the vertically-disposed orientation of bore volumes 14a, with the wicking structure (not shown) providing a non-gravity means for returning the liquid droplets to the reservoir, in known manner.

In accordance with the invention, a sealing plate 20 of high heat conductivity material, such as copper and the like, is placed in abutment with the exterior surface of reservoir member 12 and completely over an aperture 12c formed through the bottom face 12d thereof. The plate is sealed to the exterior surface 12d of the reservoir member by sealing means 22, such as a solder bead, a weldment, a coolant-tight gasket and threaded fasteners, etc., in any known manner to prevent loss of coolant 18 from the reservoir. Preferably, the sealing means will allow for relatively rapid removal of the plate 20 from reservoir 12 to facilitate interchange thereof; thus, a coolant-tight sealing gasket 24 (FIG. 2) may be suitably forced into aligned channels 25a (formed in the exterior surface of reservoir member 12) and channels 25b (formed in the mating surface of plate 20 and ringing the periphery of reservoir aperture 12c) with clamping pressure being supplied by a plurality of fastening means 26, such as threaded screws and the like, passing through apertures 20a in the plate and engaging blind tapped holes 28 in the reservoir walls.

A structure 30, such as a felt metal wick and the like, is fastened to one surface of sealing plate 20 substantially at the center thereof and within an area configured for insertion through reservoir aperture 12c, to facilitate efficient heat transfer from the plate to coolant fluid 18. Advantageously, a post 32 is utilized between the center of sealing plate 20 and the opposite wall of reservoir member 12, as a means to prevent the collapse of the reservoir during removal of non-coolant material, which removal may be accomplished by means (not shown) in one of end capping members 15, after sealing plate 20 is installed.

A semiconductor device 40, such as an appropriately doped silicon diode and the like, has a first electrode 41 fabricated thereon of a layer of highly conductive material such as copper and the like, to which layer is bonded a first electrode lead 42, of similar material. It should be understood that the cross-sectional area of first lead 42 is selected, in this particular embodiment, to provide not only the proper electrical operating conditions for semiconductor device 40, but also to provide sufficient area for a portion of the heat energy to be conducted through first electrode 41 and to be dissipated. A second electrode 44 is bonded to the opposite face of semiconductor device 40; second electrode 44 must be fabricated of a high heat conductivity material, such as copper, tungsten and the like. A second electrode lead 46 is bonded to the face of second electrode 44 furthest from semiconductor device 40. A member 48 of a high-heat-conductivity, insulating material, such as beryllia (BeO) and the like, is bonded between second electrode lead means 46 and the exterior surface of sealing plate 20. Thus, insulating member 48 is effective to electrically insulate the second electrode 44 and its associated lead means 46 from conductive sealing plate 20 and reservoir member 12, while providing a low thermal impedance path, in conjunction with second electrode 44, lead means 46, sealing plate 20 and wick member 30, for removal of heat from semiconductor device 40 into coolant fluid 18, whereby the fluid is evaporated and heat conducted away from the semiconductor device. In this manner, a high power semiconductor device may be integrally mounted upon an associated heat-energy-removal means and may be rapidly removed therefrom and replaced thereon, while being electrically isolated from that heat-energy-removal means. The heat-energy-removal means may now be maintained at ground electrical potential to reduce the shock hazard to personnel, without a sacrifice being made in degree of semiconductor device cooling. This arrangement is especially advantageous for semiconductor devices dissipating large amounts of heat energy; advantageously, second electrode member 44 is fabricated of tungsten to provide mechanical strength to a large-surface-area semiconductor device and, most importantly, to provide a layer of a material having a coefficient of thermal expansion close to that of the semiconductor material used for device 40. In this manner, the bimetallic bending of that portion 46a of second electrode lead means bonded between second electrode 44 and insulating member 48 is lessened as the semiconductor device and the associated structure experiences a rise in operating temperature. For semiconductor devices having diameters less than about ½ inch and having electrodes 41 and 44 soft soldered thereto, copper may be utilized for second electrode 44 as the soft solder yields to a sufficient degree to prevent semiconductor device breakage when the electrodes undergo heat expansion.

Figure 2:
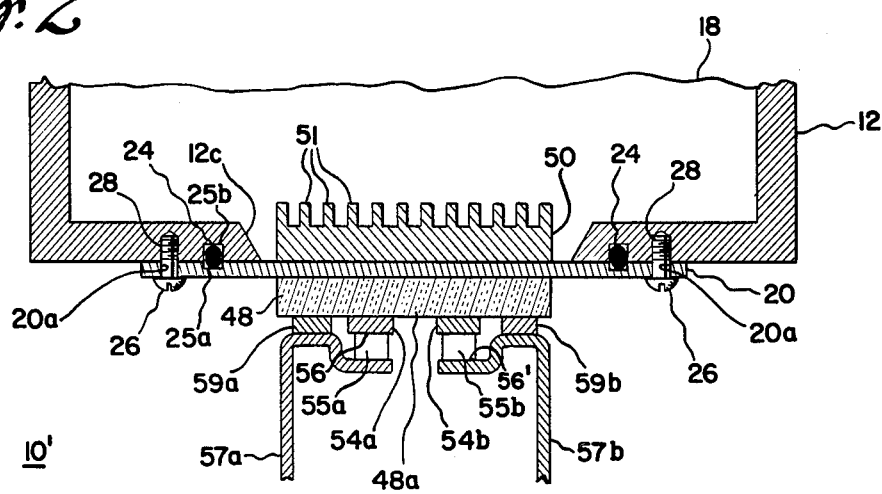
FIG. 2 is a sectional side view of a portion of a second power module, illustrating another preferred arrangement of an isolated substrate and particularly illustrating means for cooling both faces of semiconductor devices mounted thereon.

Referring now to FIG. 2, wherein like reference numerals are utilized for like elements, another preferred embodiment of heat-energy-removal means 10' utilizes a member 50 having a structured surface, such as boiling fins 51 and the like, in replacement of the felt-metal wick member 30 (FIG. 1) to achieve the required large surface area for transferring heat energy into the pool of coolant liquid 18.

A plurality of pads 54a, 54b of a high-heat-conductivity material, such as cooper and the like, are fabricated upon the outwardly-facing surface 48a of the insulating layer 48, to each receive a first electrode of an associated high power semiconductor device 55a and 55b, respectively. Thus, in accordance with one aspect of the invention with reference to this second preferred embodiment, one electrode 56 of each of at least one semiconductive structure 55, such as the anode electrode of a high-power semiconductor diode or the collector electrode of a high-power semiconductor transistor, is cooled by removal of heat energy therefrom through the low thermal impedance series structure comprising one of pads 54, member 48, plate 20 and wick structure 51 disposed in the coolant fluid 18.

In accordance with another aspect of the invention, each remaining electrode 56' of each of semiconductor devices 54a and 54b, is coupled to external circuitry (not shown) by means of leads 57a and 57b, respectively, having an end thereof attached to the associated electrode areas of the associated semiconductor device. Each of lead means 57a, 57b is fabricated of a high-termal-conductivity material and is of sufficiently large physical dimensions as to facilitate conduction of a significant proportion of the total heat energy produced by the associated semiconductor from the end, of that semiconductor device, furthest from insulating member 48. A pad 59 of high-thermal-conductivity material is fabricated upon insulating member surface 48a for each of lead means 57. Each of pads 59 is spaced from the others of the pads and from the mounting pad 54 of all semiconductor devices. Each lead means 57 is suitably bonded to its associated pad 59, with low thermal impedance therebetween. Thus, the pads, associated with each of a plurality of electrodes of each semiconductor device, are electrically isolated each from the other and from the electrically conductive portions of the heat exchange apparatus, and heat is conducted away from both ends 56, 56' of the semiconductor device to decrease the junction temperatures thereof with respect to the cooling level achieved at similar device power dissipation levels in prior art devices.

Figure 3:
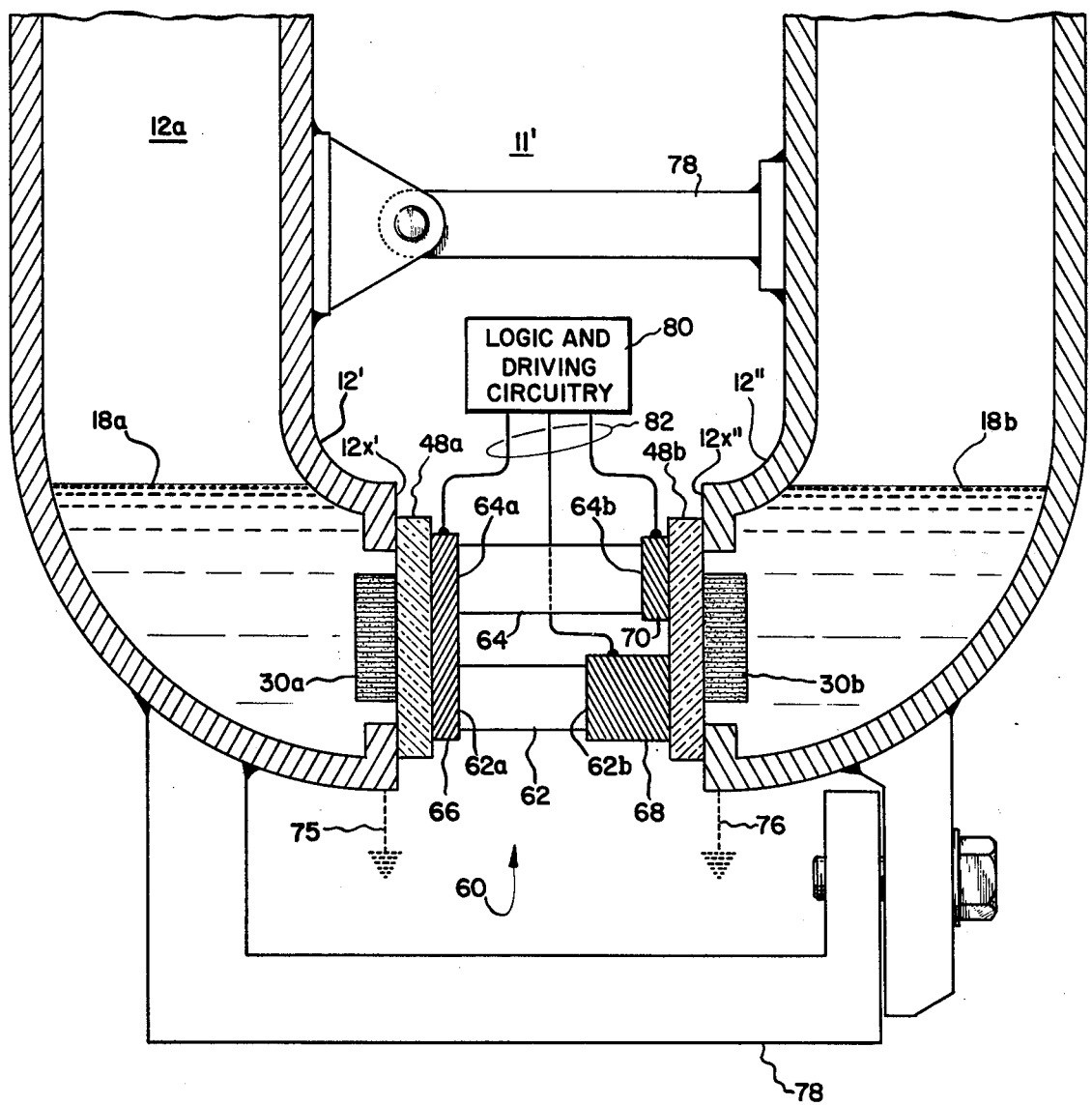
FIG. 3 is a sectional side view of a portion of another power module utilizing insulating members directly bonded to enclose the reservoir portion of each of of a pair of heat removal means, facilitating double-sided cooling of a power module.

Referring now to FIG. 3, heat-energy-removal means 11' comprises a pair of heat pipes or thermosiphons having their reservoir portions 12' and 12'', respectively, incorporating a substantially right-angle bend to have the mounting surfaces 12x' and 12x'' of each thereof facing one another. An integrated-circuit-like power module 60 is mounted between the spaced-apart, substantially parallel reservoir end surfaces 12x' and 12x''. A high-heat-conductance, electrically insulating member 48a or 48b is bonded directly to the associated one of surfaces 12x' or 12x'' and each partially encloses the associated reservoir 18a or 18b, respectively, of coolant fluid. Advantageously, each of the elbow-like lower ends of the heat removal apparatus is fabricated of a material such as copper and each of members 48a and 48b is fabricated of beryllia, with the direct bonding therebetween being carried out in accordance with the methods described in U.S. Pat. Nos. 3,911,553 (issued Oct. 14, 1975) and 3,993,411 (issued Nov. 23, 1976), both assigned to the assignee of the present invention and incorporated herein by reference. A wick structure 30a or 30b is bonded to that surface of the associated beryllia member 48a or 48b, respectively, acting as a boundary for the coolant fluid; each wicking structure may be bonded to the associated beryllia member by the direct bonding methods of the previously referred-to U.S. patents.

Illustratively, power module 60 contains a first semiconductor device 62 and a second semiconductor device 64. A pad 66 of material having both high electrical and thermal conductivity, such as copper, is fabricated upon the remaining surface of one insulating member 48a. A first electrode 62a and 64a of each semiconductor device is bonded to conductive pad 66 while a remaining electrode 62b, of semiconductor device 62, is bonded to a conductive pad 68 which is itself bonded to the other insulating member 48b. Similarly, the remaining electrode 64b of semiconductor device 64 is bonded to another conductive pad 70 which is itself also bonded to the same surface of insulating member 48b as conductor pad 68. Thus, first and second semiconductor device first electrodes 62a and 64a are electrically series connected via conductive pad 66, but are electrically insulated from the associated first heat removal means 12' (which heat removal means may now be maintained at ground potential, as at ground connection 75); the remaining electrodes 62b and 64b are electrically isolated each from the other and from the second heat removal means 12'' (which second heat removal means may also be held, independently, at electrical ground potential via ground connection 76, or may be coupled to ground potential via means 78 mechanically supporting the pair of heat removal means 12' and 12'' and, hence, the integrated power module 60 therebetween). It should be understood that each of heat removal means 12' and 12'', herein shown as thermosiphons, may be heat-pipes and may be independently coupled to any desired electrical potential, although ground potential is preferable for safety reasons. and may provide greater flexibility in controlling spurious noise generated impulses and R.F. interference. It should be understood that one or more of conductive pads 66, 68 and/or 70 may be connected to a desired electrical potential, e.g. ground potential, to even further minimize capacity and interference effects.

This embodiment is particularly advantageous, not only in that the beryllia provides a preferable match of thermal expansion characteristics between silicon semiconductor devices and copper, but also in that a structure, such as a printed circuit card 80 having logic and driving circuitry used in conjunction with the semiconductor devices of power modules 60, can now be positioned relatively physically close to the power module and coupled thereto by means of relatively short leads 82, while the parasitic capacitance between the various electrodes of the power modules and the heat pipes is minimized and does not deleteriously affect the module characteristics (particularly rise and fall times of signals coupled to devices 62 and 64) as the electrodes and their associated mounting pads 66, 68 and 70 are isolated by the beryllia members 48 from the conductive portions of the heat removal means. Thus, heat energy may be equally as well removed from each opposed side of power module 60 (bounded by members 48a and 48b) into the adjacent cooling fluid reservoir 18a and 18b, while the power devices of the module (interconnected as required) are still electrically isolated from the heat removal means to reduce parasitic capacity while providing additional personal safety. It should be understood that, while the embodiment of FIG. 3 is shown having a pair of thermosiphons (having elbow-like end extemities horizontally disposed with the semiconductor module between) a thermosiphon having a vertically disposed end, such as shown in FIG. 1, may have one insulating member, e.g., 48a, bonded thereto and a heat pipe may be vertically arranged therebelow and bonded to the remaining, lower insulating member, e.g., 48b, with that full-length additional wicking structure (not shown), characteristic of a heat-pipe, being required to return the cooling fluid upwardly against the force of gravity to a reservoir adjacent the vertically extended wick structure 30b attached to the lower insulating member.

While the present invention has been described with respect to several preferred embodiments thereof, many variations and modifications will now occur to those skilled in the art. It is our intent, therefore, to be limited only by the scope of the appending claims.

What is claimed is:

1. A cooled semiconductor power module comprising:
   a thermosiphon including a hollow block of heat-conductive material with a coolant fluid contained therein and further including an external surface from which heat energy applied thereto is conducted to vaporize a portion of said coolant fluid;
   a substrate of heat-conductive, electrically-insulative material including first and second opposed surfaces, said first surface being bonded to said external surface, and
   at least one semiconductor device including at least two electrodes, at least one of said electrodes being bonded to said second surface of said substrate.

2. The semiconductor power module of claim 1 wherein said block includes an aperture and removable plate means covering said aperture for sealing said coolant fluid in said thermosiphon, said plate means including opposed surfaces, the opposed surface of said plate means furthest from said block forming said external surface.

3. The semiconductor power module of claim 2 wherein said thermosiphon comprises a heat pipe including a wicking structure situated within said hollow block and attached to the remaining surface of said plate means for sealing.

4. The semiconductor power module of claim 2 wherein said substrate is comprised of beryllia.

5. A cooled semiconductor power module comprising:
   a thermosiphon including a hollow block of heat-conductive material with a coolant fluid contained therein and further including an external surface from which heat energy applied thereto is conducted to vaporize a portion of said coolant fluid;
   a substrate of heat-conductive, electrically-insulative material including first and second opposed surfaces, said first surface being bonded to said external surface;
   a plurality of mounting pads of highly thermally conductive material situated on the second surface of said substrate and bonded thereto;
   a plurality of semiconductor devices, each including at least two electrodes, one electrode of each of said semiconductor devices being bonded to a respective separate mounting pad, and
   a plurality of lead means, each of said lead means being bonded to each of the remaining electrodes, respectively, and further bonded to a selected one of a group consisting of the remaining mounting pads and the remaining electrodes.

6. The semiconductor power module of claim 5 wherein said thermosiphon includes an aperture, said thermosiphon further including removable plate means covering said aperture for sealing said coolant fluid in said thermosiphon, said removable plate means including opposed surfaces, the opposed surface of said plate means furthest from said block forming the external surface of said thermosiphon.

7. The semiconductor power module of claim 6 wherein said substrate is comprised of beryllia.

8. The semiconductor power module of claim 6 wherein said thermosiphon comprises a heat pipe including a wicking structure situated within said hollow block and attached to the remaining surface of said removable plate means.

9. A cooled semiconductor power module comprising:
   first and second thermosiphons each including a hollow block of heat-conductive material with a coolant fluid contained therein, and further respectively including first and second external surfaces from which heat energy applied thereto is conducted to vaporize a portion of the coolant fluid in each of said first and second thermosiphons;
   first and second substrates of heat-conductive, electrically-insulative material, each of said first and second substrates including first and second opposed surfaces, the first surface of said first substrate and the first surface of said second substrate being respectively bonded to said first and second external surfaces;
   at least one electrically-conductive mounting pad situated on each of the second surfaces of said first and second substrates, each mounting pad on the second surface of said first substrate having a corresponding mounting pad on the second surface of said second substrate; and
   at least one semiconductor device having opposed surfaces with electrodes situated on the surfaces of said semiconductor device, said semiconductor device situated between said corresponding conductive mounting pads and operatively attached thereto.

10. The semiconductor power module of claim 9 including additional semiconductor devices, each of said additional semiconductor devices being situated between corresponding conductive mounting pads, respectively, and operatively attached thereto, respectively, wherein the conductive mounting pads on one of said first and second substrates are joined to one another to form an electrical connection between selected electrodes.

11. The semiconductor power module of claim 10 wherein said substrates are comprised of beryllia.

12. The semiconductor power module of claim 10 wherein said first and second thermosiphons comprise heat pipes.